United States Patent [19]
Pitz et al.

[11] Patent Number: 4,780,332
[45] Date of Patent: Oct. 25, 1988

[54] PROCESS FOR PRODUCING ADHERENT, ELECTROCHEMICALLY REINFORCIBLE AND SOLDERABLE METAL LAYERS ON AN ALUMINUM-OXIDE CONTAINING CERAMIC SUBSTRATE

[75] Inventors: Birgit Pitz, Stuttgart; Helmut Sautter, Ditzengen; Lothar Weber, Stuttgart, all of Fed. Rep. of Germany

[73] Assignee: Robert Bosch GmbH, Stuttgart, Fed. Rep. of Germany

[21] Appl. No.: 916,710

[22] Filed: Oct. 8, 1986

[30] Foreign Application Priority Data

Oct. 18, 1985 [DE] Fed. Rep. of Germany ....... 3537161

[51] Int. Cl.[4] ............................................. B05D 5/12
[52] U.S. Cl. ........................................ 427/96; 427/98; 427/433
[58] Field of Search ............................ 427/98, 433, 96

[56] References Cited

U.S. PATENT DOCUMENTS

| | | | |
|---|---|---|---|
| Re. 30,313 | 6/1980 | Carcia | 252/518 |
| 3,481,777 | 12/1969 | Spannhake | 427/98 |
| 4,006,278 | 2/1977 | Pukaite | 428/432 |
| 4,140,817 | 2/1979 | Brown | 427/96 |
| 4,196,029 | 4/1980 | Privas | 427/98 |
| 4,247,730 | 1/1981 | Brunelle | 585/489 |
| 4,254,546 | 3/1981 | Ullrey | 252/514 |
| 4,322,316 | 3/1982 | Provance | 427/96 |
| 4,374,868 | 2/1983 | Stahl | 427/97 |
| 4,424,409 | 1/1984 | Kuttner | 361/411 |
| 4,483,810 | 11/1984 | Bunk et al. | 264/60 |
| 4,567,059 | 1/1986 | Yamaoka | 427/100 |
| 4,569,902 | 2/1986 | Saito | 148/6.31 |
| 4,599,277 | 7/1986 | Brownlow | 428/689 |
| 4,657,778 | 4/1987 | Moran | 427/98 |

OTHER PUBLICATIONS

Gerald Katz "Adhesion of Copper Films to Aluminum Oxide Using a Spinel Structure Interface" Thin Solid Films, vol. 33, 1976, pp. 99–105.
M. Wittmer, C. R. Boer, P. Gudmundson, J. Carlson, "Mechanical Properties of Liquid-Phase-Bonded Copper-Ceramic Substrates, May 13, 1981, pp. 149–153, Journal of the American Ceramic Society.

Primary Examiner—Shrive Beck
Assistant Examiner—Vi Duong Dang
Attorney, Agent, or Firm—Frishauf, Holtz, Goodman & Woodward

[57] ABSTRACT

A screen-printing paste containing $Cu_2O$ or $NiO$ and preferably aluminum oxide or, more preferably, an aluminum compound such as aluminum acetylacetonate which forms aluminum oxide under calcination heat, is printed over an entire surface of a substrate consisting of aluminum oxide ceramic, after which it is calcined in air at from 800° to 1350° C. to produce an adhesion-promoting spinel layer. That layer is then metallized by plating in an electroless bath for deposition of copper or nickel, as the case may be, after which the metal layer thus deposited is reinforced galvanically. A positive photoresist layer can be applied to the electroless deposited copper or nickel layer, illuminated through an appropriate mask and developed to expose a desired pattern of the underlying electroless copper layer for galvanic reinforcement, so that after removal of the unexposed portion of the mask the unreinforced electroless layer can be removed by etching without impairment of the reinforced conducting pattern.

9 Claims, No Drawings

PROCESS FOR PRODUCING ADHERENT, ELECTROCHEMICALLY REINFORCIBLE AND SOLDERABLE METAL LAYERS ON AN ALUMINUM-OXIDE CONTAINING CERAMIC SUBSTRATE

It is known to provide an adherent copper layer on an $Al_2O_3$-containing ceramic by substrate burning in (calcining) both copper oxide and metallic copper on the substrate, in which case the calcination must be so controlled that metallic copper persists in sufficient quantity in order to make possible subsequent galvanic reinforcement. The layers thus produced are, on the one hand, relatively thick and, on the other hand, absolutely require an oxygen-free calcination atmosphere, thus involving a high cost production apparatus. Furthermore, copper layers applied to such substrates by that known method do not meet the requirement of many purposes regarding permanence of the adherence of the copper layer to the substrate. No process analogous to the known process just described is known for producing adherent nickel layers.

SUMMARY OF THE INVENTION

It is an object of the present invention to produce adherent, solderable and electrochemically reinforcible metal layers on an aluminum oxide containing ceramic substrate which meet a wider range of requirements regarding permanence of adherence by a process which does not require calcination in an oxygen-free atmosphere.

Briefly, a screen printing paste layer containing an oxide of a conducting metal capable of forming a spinel oxide compound with $Al_2O_3$ is made into a screen printing paste and is applied by screen printing to an entire surface of screen-printable configuration of an aluminum oxide containing ceramic substrate, then calcined in air in the range from 800° to 1350° C., then electrolessly metallized and, finally, galvanically reinforced.

The process of the invention has the advantage that the adhesion promoting intermediate layer of spinel lends itself well to formation by calcination in air, that the adherence of the metal layer applied to the adhesion promoting layer is substantially improved and that the method is usable with aluminum spinel forming metals other than copper, notably nickel.

It is particularly useful in the practice of the process of the invention, in order to obtain improved adhesion, to include in the screen printing paste either aluminum oxide or at least one aluminum compound which yields aluminum oxide during calcination, or both aluminum oxide and at least one aluminum compound which yields aluminum oxide during calcination, preferably in a quantity relative to the other metal oxide for the aluminum spinel, corresponding to the stoichiometric proportions for producing the spinel. Aluminum acetylacetonate, Al $(C_5H_7O_3)_3$ has been found particularly useful as an aluminum compound for producing aluminum oxide and ultimately the spinel during calcination because it has the advantage relative to powdered aluminum oxide that it is soluble in the screen printing paste and thus provides a very homogeneous film when screen printed. This compound accordingly, preferably provides between 10 and 100% of the aluminum oxide for the stoichiometric conversion into the desired spinel.

DESCRIPTION OF AN ILLUSTRATIVE EXAMPLE

A substrate of an aluminum oxide ceramic in the form of a small plate was screen printed over all of one of its plate surfaces with a screen printing paste having the following composition:

| Quantity | Material |
| --- | --- |
| 8.2 g | Paste vehicle consisting of 100 parts by weight of a solvent mixture composed of 40 parts by volume of cyclohexane, 80 parts by volume of benzyl alcohol, 50 parts by volume of α-terpineol and, as thickener, 15 parts by weight of ethylcellulose. |
| 0.635 g | Aluminum acetylacetonate |
| 3.0 g | Solvent mixture of the above-described composition |
| 0.9 g | $Cu_2O$. |

After drying the paste, the printed substrate was heat treated in air at 1200° C. for between 0.5 and one hour, during which at first the $Cu_2O$ was converted into CuO and the aluminum acetylacetonate was converted into $Al_2O_3$ and then the CuO reacted to form copper spinel both with the $Al_2O_3$ in the paste and with $Al_2O_3$ of the substrate surface according to the formula:

$$CuO + Al_2O_3 \rightarrow CuAl_2O_4$$

After cooling, the spinel layer now produced on the surface of the aluminum oxide substrate, was copper plated in an ordinary commercially available electroless copper bath, as the result of which a thin copper layer of the thickness of about 1 μ was produced on the surface of the substrate. This copper layer can, according to the requirements of the intended use of the article, be reinforced in a galvanic copper plating bath or, if desired, can be etched into a pattern after first being coated with a photoresist layer, which is exposed through a suitable mask and then developed. After the pattern is produced, galvanic reinforcement can be provided only to the portion of the copper layer in the pattern and, if desired, a coating of lead-tin alloy can be provided to improve the solderability. It is convenient to provide a galvanic reinforcement and even the solder-tin layer before the unexposed photoresist is removed, because when that photoresist is removed after the reinforcement and tinning of the conducting pattern, the residual galvanically reinforced layer of electroless copper plating can be quite simply removed in an etching bath without impairment of the desired conducting pattern.

If, instead of $Cu_2O$, nickel oxide (NiO) is contained in the screen printing paste, a nickel spinel, $NiAl_2O_4$ is produced on the screen-printed substrate surface, providing an adhesion promoting intermediate layer on which a nickel layer can be deposited by an electroless process by the use of a bath containing commerciallly available electroless plating reagents. In this case also, it is desirable for the screen printing paste to contain aluminum acetylacetonate and/or aluminum oxide for improvement of the permanence of adhesion of the nickel layer. These spinels produced on the substrate surface during the heat treatment (calcination) according to the invention are electrically insulating materials, so that these spinels are well suited for use as intermediate layers in the production of conducting paths on the substrate, because of the possibility of depositing strongly adherent metallic layers thereon by electroless deposition in a suitable bath.

Although the invention has been described with reference to a particular illustrative example, it will be understood that variations and modifications are possible within the inventive concept. For example, the screen-printed substrate surface need not be strictly flat to be screeb-printable. It may have small irregularities or it may have a moderate general curvature and still permit the application of a layer of paste of sufficiently uniform thickness to produce a complete coverage by a spinel layer after calcination.

We claim:

1. Process for producing adherent, solderable and electrochemically reinforceable metal layers on an aluminum-oxide containing ceramic substrate comprising the steps of:

applying by screen printing, to an entire surface of screen-printable configuration on a said substrate, a screen printing paste layer containing (a) an oxide of a conducting metal capable of forming a spinel oxide compound with $Al_2O_3$ and (b) material selected from the group consisting of $Al_2O_3$ and aluminum compounds which produce $Al_2O_3$ at a temperature in the range from 800° to 135° C., said selected material including aluminum acetylacetonate;

calcining said paste layer on said substrate surface in air at a temperature in the range from 800° to 1350° C. to produce $Al_2O_3$ from at least one said aluminum compound at said temperature and to produce from $Al_2O_3$ and said oxide of a conducting metal, a layer of spinel oxide compound on said substrate;

electrolessly metallizing said calcined layer; and galvanically reinforcing said electrolessly metallized layer.

2. Process according to claim 1, in which said paste contains an aluminum compound in a quantity corresponding to the provision of 8 to 12% by weight of the amount of $Al_2O_3$ required for a stoichiometric conversion of MeO to spinel according to the equation $MeO + Al_2O_3 \rightarrow MeAl_2O_4$, wherein Me is a metal selected from the group consisting of Cu and Ni.

3. Process according to claim 2, in which between 10 and 100% by weight of the $Al_2O_3$ contributed by aluminum compounds in said paste for stoichiometric conversion according to said equation is contributed by said aluminum acetylacetonate content of said paste.

4. Process for producing adherent, solderable and electrochemically reinforceable metal alyers on an aluminum-oxide containing ceramic substrate comprising the steps of:

applying by screen printing, to an entire surface of screen-printable configuration on said substrate, a screen printing paste layer containing (a)$Cu_2O$ for subsequently forming a spinel oxide compound with $Al_2O_3$ and (b) material selected from the group consisting of $Al_2O_3$ and aluminum compounds which produce $Al_2O_3$ at a temperature in the range from 800° to 1350° C., said selected material including aluminum acetylacetonate:

calcining said paste layer on said substrate surface in air at a temperature in the range from 800° to 1350° C. to produce $Al_2O_3$ from at least one said aluminum compound at said temperature and to produce, from $Al_2O_3$ and said $Cu_2O$, a copper spinel layer on said substrate;

electrolessly copper plating said copper spinel layer; and galvanically reinforcing said electrolessly copper plated layer.

5. Process according to claim 4, in which said paste contains an aluminum compound in a quantity corresponding to the provision of 8 to 12% by weight of the amount of $Al_2O_3$ required for stoichiometric conversion of $Cu_2O$ to spinel according to the equations $2Cu_2O + O_2 \rightarrow 4\ CuO$ and $CuO + Al_2O_3 \rightarrow CuAl_2O_4$.

6. Process according to claim 5, in which between 10 and 100% by weight of the $Al_2O_3$ contributed by aluminum compounds in said paste for stoichiometric conversion according to said equation is contributed by said aluminum acetylacetonate content of said paste.

7. Process for producing adherent, solderable and electrochemically reinforceable metal layers on an aluminum-oxide containing ceramic substrate comprising the steps of:

applying by screen printing, to an entire surface of screen-printable configuration on a said substrate, a screen printing paste layer containing (a) NiO for subsequently forming a spinel oxide compound with $Al_2O_3$ and (b) material selected from the group consisting of $Al_2O_3$ and aluminum compounds which produce $Al_2O_3$ at a temperature in the range from 800° to 1350° C., said selected material including aluminum acetylacetonate;

calcining said paste layer on said substrate surface in air at a temperature in the range from 800° to 1350° C. to produce $Al_2O_3$ from at least one said aluminum compound at said temperature and to produce, from $Al_2O_3$ and said NiO, a nickel spinel layer on said substrate;

electrolessly nickel plating said nickel spinel layer; and galvanically reinforcing said electrolessly nickel plated layer.

8. Process according to claim 7, in which said paste contains an aluminum compound in a quantity corresponding to the provision of 8 to 12% by weight of the amount of $Al_2O_3$ required for a stoichiometric conversion of NiO to spinel according to the equation $NiO + Al_2O_3 \rightarrow NiAl_2O_4$.

9. Process according to claim 8, in which between 10 and 100% by weight of the $Al_2O_3$ contributed by aluminum compounds in said paste for stoichiometric conversion according to said equation is contributed by said aluminum acetylacetonate content of said paste.

* * * * *